United States Patent [19]

Kameyama et al.

[11] Patent Number: 5,328,583
[45] Date of Patent: Jul. 12, 1994

[54] SPUTTERING APPARATUS AND PROCESS FOR FORMING LAMINATION FILM EMPLOYING THE APPARATUS

[75] Inventors: Makoto Kameyama, Funabashi; Kenji Ando, Kawasaki, both of Japan

[73] Assignee: Canon Kabushiki Kaisha, Tokyo, Japan

[21] Appl. No.: 971,063

[22] Filed: Nov. 3, 1992

[30] Foreign Application Priority Data

| Nov. 5, 1991 | [JP] | Japan | 3-315267 |
| Nov. 5, 1991 | [JP] | Japan | 3-315268 |
| Nov. 18, 1991 | [JP] | Japan | 3-301720 |
| Nov. 19, 1991 | [JP] | Japan | 3-302890 |

[51] Int. Cl.$^5$ .............................. C23C 14/34
[52] U.S. Cl. .................. 204/192.12; 204/192.15; 204/192.2; 204/298.08; 204/298.11; 204/298.15; 204/298.26; 204/298.28
[58] Field of Search ............ 204/192.12, 192.15, 204/192.2, 192.13, 298.08, 298.11, 298.23, 298.26, 298.28, 298.27, 298.13, 298.15, 298.16

[56] References Cited

U.S. PATENT DOCUMENTS

| 4,767,516 | 8/1988 | Nakatsuka et al. | 204/192.2 X |
| 4,997,539 | 3/1991 | Komizo et al. | 204/192.2 |
| 5,000,834 | 3/1991 | Yoshikawa | 204/192.2 X |

FOREIGN PATENT DOCUMENTS

| 54-3238 | 2/1979 | Japan . |
| 60-47215 | 3/1985 | Japan . |
| 60-205805 | 10/1985 | Japan . |
| 61-3311 | 1/1986 | Japan . |
| 61-60908 | 12/1986 | Japan . |
| 61-61164 | 12/1986 | Japan . |
| 63-20304 | 4/1988 | Japan . |
| 63-43465 | 8/1988 | Japan . |

OTHER PUBLICATIONS

Ohyo Butsuri (Applied Physics), vol. 48, No. 6 (1979) pp. 558–559.

Primary Examiner—Nam Nguyen
Attorney, Agent, or Firm—Fitzpatrick, Cella, Harper & Scinto

[57] ABSTRACT

A sputtering apparatus comprises at least one pair of first sputtering targets arranged in counterposition; a second sputtering target provided substantially on a concentric circle having the center axis of the first sputtering targets; and a substrate holder for holding a substrate to be coated with particles of target materials emitted from the first sputtering targets and the second sputtering target, which is provided substantially on another concentric circle having the center axis outside the second sputtering target.

15 Claims, 6 Drawing Sheets

SPUTTERING APPARATUS AND PROCESS FOR FORMING LAMINATION FILM EMPLOYING THE APPARATUS

BACKGROUND OF THE INVENTION

1. Field of the Invention

The present invention relates to a sputtering apparatus, and a process for forming a lamination film employing the sputtering apparatus. More particularly, the present invention relates to a sputtering apparatus which is capable of effectively forming a lamination film of a magnetic thin film and a non-magnetic thin film, and a process for forming a lamination film employing the sputtering apparatus.

In recent magnetic recording, the magnetic thin film for use for the recording medium and the magnetic head is desired to be improved further to achieve higher reliability and higher recording density. In particular, in forming a magnetic thin film, high efficiency is desired to mass-produce of recording mediums and magnetic heads.

Hitherto, magnetic thin films have been formed by use of a diode sputtering apparatus such as the one described in Japanese Patent Publication No. 61-61164. Such sputtering apparatuses form films only at a low speed, and are not suitable for mass-production of magnetic thin films.

On the other hand, magnetron sputtering apparatuses have come to be used widely for formation of thin semiconductor films because of the high film forming speed. In this apparatus, high speed film formation is made feasible by raising the density of plasma around the target by utilizing a magnetic field which is generated by a magnet placed on the backside of the target. However, even with this apparatus, if a magnetic material is used as the target, the magnetic fluxes penetrate through the target to decrease flux leakage around the target disadvantageously, resulting in no increase in the plasma density and the film formation speed.

Counterposing target type sputtering apparatuses are reported to offset the above disadvantages (see Ohyo Butsuri (Applied Physics), Vol. 48, No. 6, (1979), pp. 558–559; and Japanese Patent Publication Nos. 63-43465, 61-60908, and 63-20304). FIG. 6 illustrates a schematic diagram of such a type of apparatus. In the apparatus as shown in FIG. 6, a pair of targets $t_1$ and $t_2$ are placed with their sputtering faces $t_{1S}$ and $t_{2S}$ counterposed across the space S. Magnetic field-generating means $h_1$ and $h_2$ are provided to generate a magnetic field H in a direction perpendicular to the sputtering faces $t_{1S}$ and $t_{2S}$. A substrate 625 is set on a holder 626 which is placed on the lateral side of the space S between the target to form a film on the surface of the substrate. With this apparatus, a film can be formed at a low temperature at a high speed. More specifically, in FIG. 6, if a magnetic field H of from 300 to 500 Oe is generated in a direction perpendicular to the sputtering surfaces $t_{1S}$ and $t_{2S}$, high-energy electrons emitted from the sputtering surfaces $t_{1S}$ and $t_{2S}$ are enclosed within the space between the counterposed targets. Accordingly, a number of the electrons do not reach the substrate 625, so that an ion-focusing electric field is not formed, whereby ionization of the sputtered gas is accelerated and sputtering speed is raised. Furthermore, since collision of the electrons against the substrate 625 is negligible, the temperature of the substrate does not rise significantly.

However, in formation of a lamination film composed of a magnetic thin film and a non-magnetic thin film as described in Japanese Patent Publication No. 54-3238 and Japanese Patent Application Laid-Open Nos. 60-205808 and 61-3311, etc., or a lamination film composed of a magnetic thin film and a non-magnetic thin film for a magnetic head as described in Japanese Patent Application Laid-Open No. 60-47215, the aforementioned conventional sputtering apparatuses need an additional apparatus or a vacuum chamber for forming a non-magnetic thin film. Therefore, in the case where magnetic thin films and non-magnetic films are laminated alternately, the substrate holder needs to be moved between the apparatuses or a vacuum chambers, which requires large apparatus construction, raising the apparatus cost, causing loss of time for the holder movement, and raising the production cost of the lamination film. If the substrate is exposed to the outer air during the movement of the substrate holder, additional problem arises that the quality of the lamination film deteriorates owing to change of the film composition by oxidation or to dirt adherence.

SUMMARY OF THE INVENTION

An object of the present invention is to provide a sputtering apparatus which is free from the above technical problems and is capable of efficiently providing a lamination film composed of magnetic thin films and non-magnetic thin films with high quality at a low cost.

Another object of the present invention is to provide a process for forming a lamination film by use of the sputtering apparatus of the present invention.

DESCRIPTION OF THE PREFERRED EMBODIMENT

The preferred embodiment of the sputtering apparatus according to the present invention is a sputtering apparatus which comprises at least one pair of first sputtering targets arranged in counterposition; a second sputtering target provided substantially on a concentric circle having the center axis of the first sputtering targets; and a substrate holder for holding a substrate to be coated with particles of target materials emitted from the first sputtering targets and the second sputtering target, which is provided substantially on another concentric circle having its center axis outside the second sputtering target.

The preferred embodiment of the process for forming a lamination film according to the present invention is a process for forming a lamination film, which comprises the steps of vacuum evacuating a vacuum chamber; introducing a sputtering gas into the vacuum chamber; applying voltage onto at least one pair of first sputtering targets arranged in counterposition to generate plasma, thereby emitting particles of the material of the first sputtering targets by action of the plasma, and to coat with particles of the material of first sputtering targets a substrate which is provided substantially on a concentric circle having a center axis of the first sputtering targets; and applying voltage onto a second sputtering target provided substantially on another concentric circle having the center axis inside the substrate to generate plasma, thereby emitting particles of the second sputtering target by action of the plasma, to coat the substrate with particles of the material of the second sputtering target.

Example

The present invention is described in detail with reference to the drawings.

Figure 1:
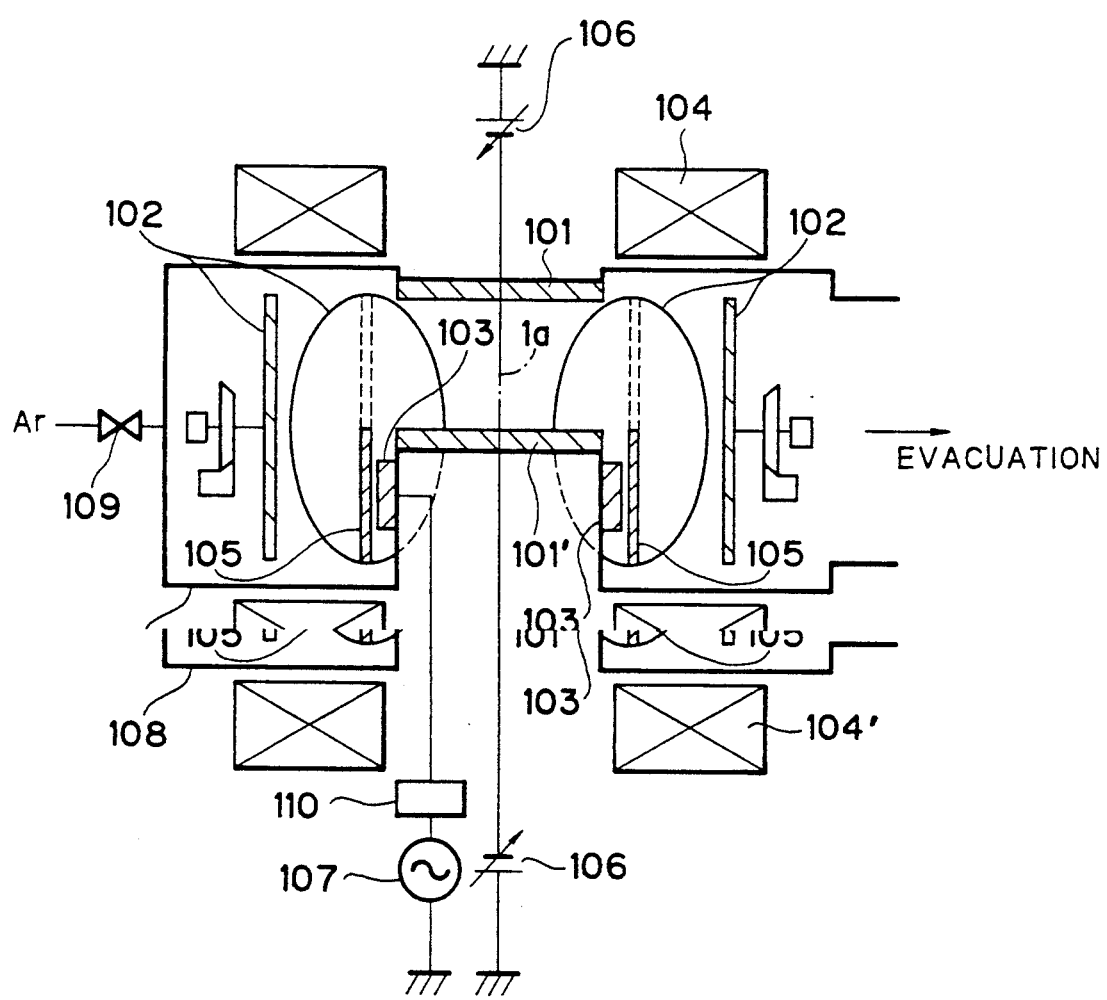
FIGS. 1 to 5 are schematic views showing examples of the sputtering apparatuses of the present invention.

FIG. 1 illustrates schematically a sputtering apparatus of the present invention. The apparatus has a magnetic targets 101 and 101' made of a magnetic material such as Sendust. The magnetic targets are disk-shaped and are held horizontally in counterposition with a suitable vertical distance. A vertical center axis 1a passes the centers of the magnetic targets 101 and 101'. A plurality of substrate holders 102 are placed around the magnetic targets 101 and 101' so as to face to the space between the magnetic targets 101 and 101'. The substrate holders 102 are capable of rotating on a horizontal axis intersecting the aforementioned center axis 1a and move as a whole around the center axis 1a by means of a mechanism not shown in the drawing. A cylindrical non-magnetic target 103 made of $SiO_2$ or the like is placed below and around the magnetic target 101' so as not to face the space between the magnetic targets 101 and 101' but to face the substrate holders 102. A cylindrical shutter 105 is provided to have the center axis 1a in common, and is movable between the upper position shown by a solid line in the drawing and the lower position shown by the dotted line in the drawing along the center axis 1a. The shutter 105 is moved by a known moving means such as a ball screw and an air cylinder. The shutter 105, at the lower position, shields the non-magnetic target 103 and makes the space between the magnetic targets 101 and 101' open to the substrate holders 102, while the shutter 105, at the upper position, makes the non-magnetic target open to the substrate holders 102 and shut the space between the magnetic targets 101 and 101'. The construction members described above are encased in a vacuum chamber. Helmholz coils 104 and 104' generate a magnetic field in the vacuum chamber 108. DC power sources 106 are connected to the magnetic targets 101 and 101', and a high-frequency power source 107 is connected to the non-magnetic target 103. A matching circuit 110 is connected thereto. A valve 109 is provided in the path for introducing a sputtering gas such as Ar into the vacuum chamber 108.

A process for forming a lamination film constructed of magnetic thin films and non-magnetic thin films by use of the sputtering apparatus of FIG. 1 is described below.

Substrates are set on the inside face of the substrate holders 102. The vacuum chamber 108 is closed tightly, and evacuated to a vacuum of about $1 \times 10^{-6}$ Torr by a vacuum pump not shown in the drawing. Then the gas-introducing valve 109 is opened and as a sputtering gas an inert gas such as Ar is introduced so that the inside of the chamber is set to a pressure of about $5 \times 10^{-3}$ Torr. The inside is controlled to maintain a stable state. The shutter 105 is elevated to the upper position shown by the dotted line to shield the substrate from the space between the magnetic targets 101 and 101'. Electric current is made to flow through the Helmholz coils 104 and 104' to generate a magnetic field, e.g., of about 400 Oe, in the space between the targets 101 and 101'. Then voltage, e.g., of 1 kV, is applied by means of a DC power source 106 to the magnetic targets 101 and 101', e.g., made of Sendust, to ionize the Ar gas, thereby sputtering being started by collision of the Ar ions against the magnetic targets 101 and 101'. The ion current, e.g., of 5 A, flows at the start of the sputtering. The pre-sputtering is conducted under the above conditions, e.g., for 10 minutes to clean the surfaces of the magnetic targets 101 and 101'. The substrate holders 102 are made to start rotation on the own axis and movement around the center axis. The shutter 105 is pulled down to the lower position shown by the solid line in the drawing to open the space between the magnetic targets 101 and 101' to the substrate and to start the formation of magnetic thin films on the substrates. The sputtering is continued in this state, e.g., for about 60 minutes. Thereafter the power source 106 is turned off. Thus the formation of the first layer is completed.

Then, to the non-magnetic target 103 made of a material such as of $SiO_2$, etc. electric power e.g., of 2 kW, is applied by the high-frequency power source 107 to generate high-frequency plasma of Ar gas. The pre-sputtering is conducted in this state, e.g., for 5 minutes. Thereafter, the shutter 105 is elevated to the upper position shown by the dotted line in the drawing to bring the non-magnetic target 103 open to the substrates and to start the formation of non-magnetic thin film on the substrates. The sputtering is continued, e.g., for about 10 minutes. Thereafter the power source 107 is turned off. Thus the formation of the second layer is completed.

The operations of the first layer formation and the second layer formation are repeated to form a lamination film constructed of about ten layers. Thereby, in the lamination film, the thickness of one magnetic thin film layer can be made, e.g., to be 3 μm, and the thickness of one non-magnetic thin film layer can be made, e.g., to be 0.2 μm. The thickness of one layer can be controlled as desired by setting suitably the applied power and the sputtering time in the sputtering operation.

A lamination film constructed of magnetic thin films and non-magnetic thin films was prepared practically according to the process above. The resulting lamination film was found to have excellent properties.

Naturally, the material of the magnetic target is not limited to the aforementioned Sendust, and the material of the non-magnetic target is not limited to the aforementioned $SiO_2$. If the material of the counterposed magnetic targets is insulating, the power source for applying the voltage to the target needs to be a high-frequency power source in place of the DC power source 106. Further, the positions of the magnetic target and the non-magnetic target may be reversed.

Figure 2:
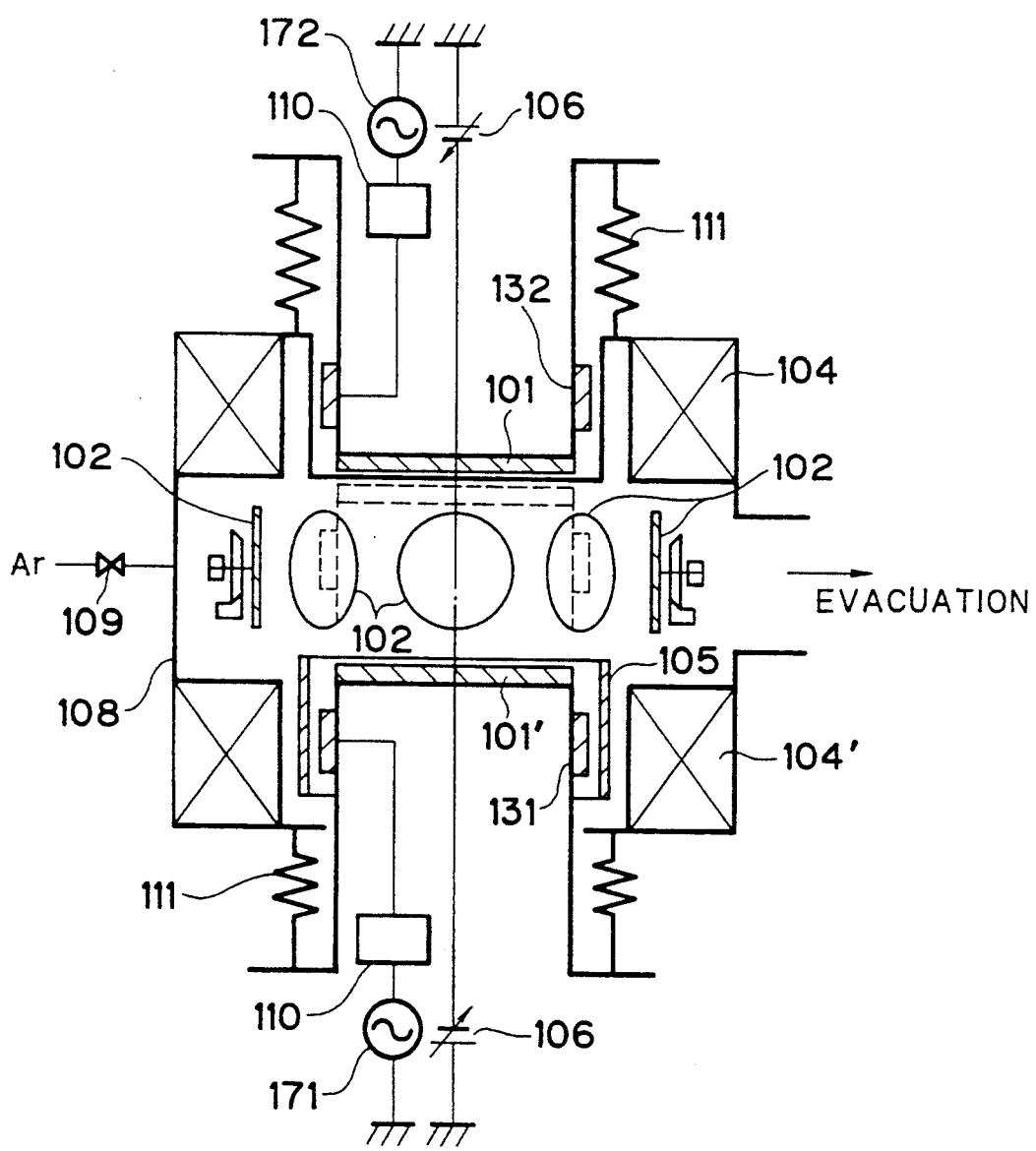

FIG. 2 is a schematic view showing another example of the sputtering apparatus of the present invention. In FIG. 2, the reference numbers for the members have respectively the same meaning as in FIG. 1.

In this example, two kinds of non-magnetic targets are employed. That is, a first non-magnetic target 131 is placed around the lower magnetic target 101', and a second non-magnetic target 132 is placed around the upper magnetic target 101. Thereto, high-frequency power source 171 and 172 are connected respectively. Bellows 111 expand or contract when the upper magnetic target 101 and the upper non-magnetic target 132 are moved vertically or when the lower magnetic target 101' and the lower non-magnetic target 131 are moved vertically.

With the sputtering apparatus as shown in FIG. 2, a lamination film of magnetic thin film layers and non-magnetic thin film layers is formed as described below.

Substrates composed, e.g., of ferrite, are set on the inside face of the substrate holders 102 respectively. The vacuum chamber 108 is closed tightly, and evacuated to a vacuum of about $1 \times 10^{-6}$ Torr by a vacuum pump not shown in the drawing. Then the gas-introducing valve 109 is opened and an inert gas such as Ar is introduced to a pressure of about $5 \times 10^{-3}$ Torr. The inside of the chamber is controlled to maintain the state stably. The non-magnetic target 131 composed, e.g., of chromium (Cr) together with the magnetic target 101' are elevated to the upper position shown by the dotted line, and simultaneously the shutter 105 is elevated to shield the non-magnetic target 131 from the substrate. Electric current is made to flow through the Helmholz coils 104 and 104' to generate a magnetic field, e.g., of about 400 Oe around the non-magnetic target 131. Then, electric power, e.g., of 2 kW, is applied to the non-magnetic target 131 by the high-frequency power source 171 to generate high-frequency plasma of Ar gas. The pre-sputtering is conducted, e.g., for 5 minutes. Then, the substrate holders 102 are made to start rotating on their own respective axes and to move around the central axis. Thereafter the shutter 105 only is pulled down to the lower position shown by the solid line in the drawing to bring the non-magnetic target 131 open to the substrate and to start the formation of non-magnetic thin films on the substrates. The sputtering is continued, e.g., for 3 minutes. Thereafter the power source 171 is turned off. Thus the formation of Cr subbing layers as the first layer is completed.

Then the non-magnetic target 131 is pulled down to the lower position shown by the solid line in the drawing, and the shutter 105 is elevated to the upper position to shield the space between the magnetic targets 101 and 101' from the substrate. To the magnetic targets 101 and 101', e.g., made of Sendust, voltage, e.g., of 1 kV is applied to ionize the Ar gas. Thereby sputtering is started by collision of the Ar ions against the magnetic targets 101 and 101'. Ion current, e.g., of 5 A flows at the start of the sputtering. Pre-sputtering is conducted in this state, e.g., for 10 minutes. Then, the substrate holders 102 are made to start rotating on their own respective axes and to move around the center axis. Thereafter the shutter 105 is pulled down to the lower position shown by the solid line in the drawing to bring the magnetic target 101 and 101' open to the substrate and to start the formation of magnetic thin films on the substrates. The sputtering is continued in this state, e.g., for 3 hours. 1 Thereafter the power source 106 is turned off. Thus the formation of magnetic Sendust films is completed as the second layer.

Then the non-magnetic target 132 made, e.g., of $SiO_2$, and the magnetic target 101 are together pulled down to the lower position (the same as the upper position of the aforementioned non-magnetic target 131), and simultaneously the shutter 105 is elevated to the upper position to shield the non-magnetic target 132 from the substrate. To the non-magnetic target 132, electric power, e.g., of 2 kW is applied by the high-frequency power source 172 to generate high-frequency Ar gas plasma. In this state, pre-sputtering is conducted, e.g., for 5 minutes. Thereafter, the substrate holders 102 are made to start rotating on their own axes and to move around the center axis, and the shutter 105 is pulled down to the lower position to bring the non-magnetic target 132 to an open state to the substrates and to start formation of the non-magnetic thin films on the substrates. The sputtering is continued, e.g., for 10 minutes. Then the power source 172 is turned off. Thus the formation of protecting films of $SiO_2$ as the third layer is completed.

In the lamination film consisting of three layers as described above, the thickness of the first layer (the Cr subbing layer) can be controlled, e.g., to be 0.1 $\mu$m; that of the second layer (the magnetic Sendust film), e.g., to be 10 $\mu$m; and that of the third layer (the protecting $SiO_2$ film), e.g., to be 0.2 $\mu$m. The thicknesses of the layers are controlled as desired by setting the applied electric power and the sputtering time in the sputtering operation. A lamination film composed of a magnetic thin film and a non-magnetic thin film was practically prepared. The resulting lamination film was found to have excellent properties.

As described above, according to the present invention, a lamination film can be formed in one vacuum chamber by switching rapidly the process between magnetic thin film formation and non-magnetic film formation. Therefore, a lamination film composed of a magnetic thin film and a non-magnetic thin film can be formed efficiently with high quality, at a lower apparatus cost and a lower production cost.

The sputtering apparatus of the present invention may suitably be modified.

For example, a deposition-preventing plate may be provided between adjacent substrate holders to partition the substrate holders, whereby, in reverse sputtering for cleaning the substrate, sputtered particles from an opposed or adjacent substrate holder can be captured by the deposition-preventing plate and the deposition of the sputtered particles on the surface of substrates or targets can be prevented.

Figure 3:
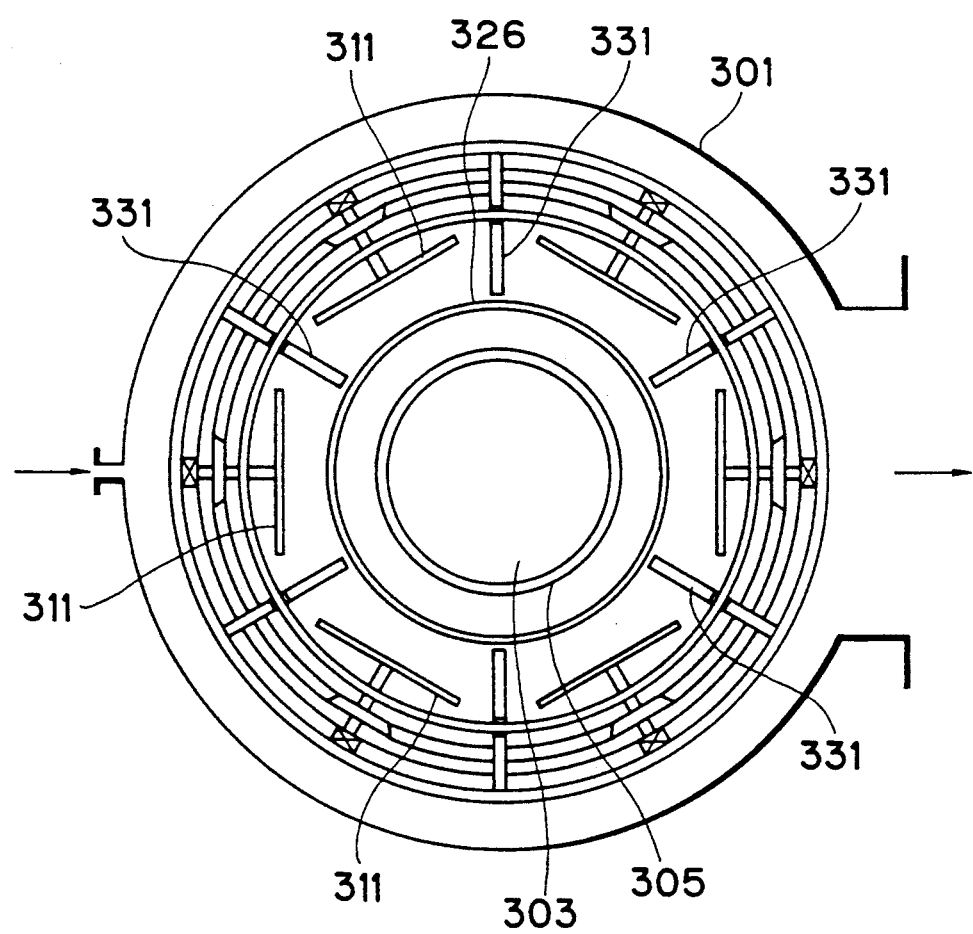

FIG. 3 illustrates schematically a sectional view of a sputtering apparatus provided with such deposition-preventing plates. In FIG. 3, the apparatus comprises a vacuum chamber 301; a pair of targets (only one target 303 is shown in the drawing); substrate holders 311 substantially placed on a concentric circle having the center axis of the target 303; deposition-preventing plates 331 placed between adjacent substrate holders; a cylindrical deposition preventing plate, namely a shutter 326; and a cylindrical target 305 substantially placed on a concentric circle having the center axis of the target 303. The target 305 is cylindrical in this example, but may be replaced by a plurality of plates.

In the sputtering apparatus as shown in FIG. 3 substrates are cleaned as described below.

The substrates are set on the substrate holders 311. The vacuum chamber 301 is closed tightly, and evacuated to a vacuum of about $5 \times 10^{-5}$ Pa by a vacuum apparatus. Simultaneously with the evacuation, the substrates are heated at a predetermined temperature. To the evacuated vacuum chamber 301, an inert gas (e.g., argon) is introduced in a predetermined amount from an inert gas supplying apparatus. Then high-frequency wave is applied to the substrate holder 311 from a high-frequency power source not shown in the drawing to ionize argon. The argon ions collide against the substrate holders 311, the substrates, and the like, thereby causing emission of sputtering particles therefrom. The particles reach the deposition-preventing plates 326 and 331 and are captured thereby to deposit thereon. Therefore, the surface of the substrate cleaned by sputtering is not contaminated with sputtered particles from other substrate holders 311, and is kept clean. In the cleaning of the substrates, the substrate holders may either be rotated and moved around, or not.

When the reverse sputtering is finished, the high-frequency power source is turned off, and pre-sputtering is started for next cleaning of targets.

With the sputtering apparatus shown in FIG. 3, in which sputtered particles are captured by deposition-preventing plates to keep the substrates clean, films with stronger adhesion can be formed on the substrate in the subsequent sputtering process.

Figure 4:
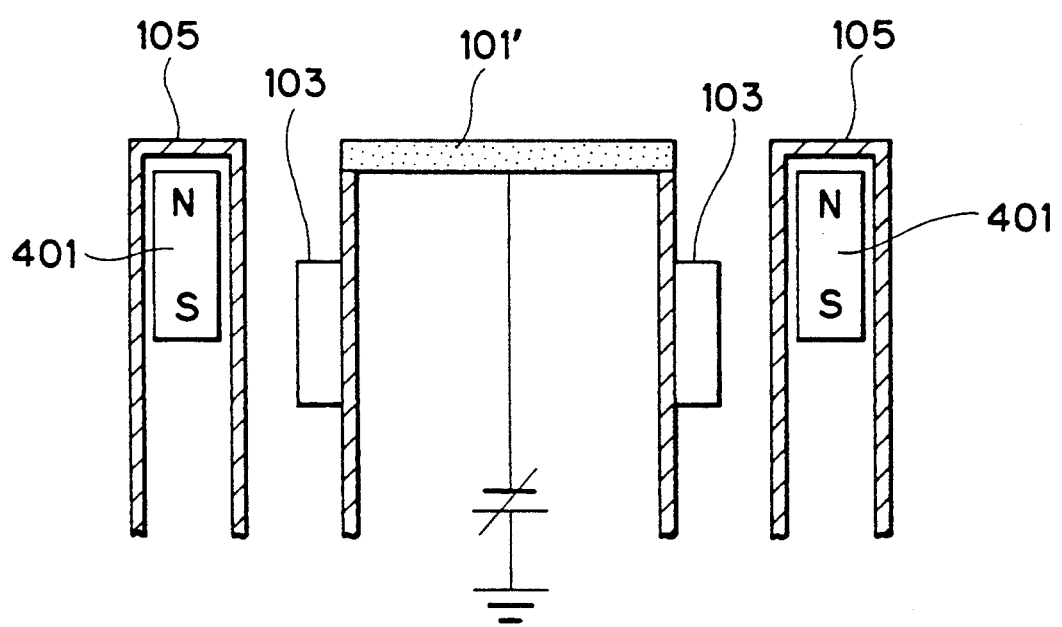

In still another modification of the sputtering apparatus of the present invention, a magnetic field-generating means is provided in the interior of the shutter 105 of the apparatus as shown in FIG. 1. This magnetic field-generating means catches magnetic film which has peeled off from parts other than the substrates. FIG. 4 illustrates schematically such an apparatus. In FIG. 4, the numeral 101' indicates one of opposing targets; the numeral 103 indicates a target placed on a concentric circle having the center axis of the target 101'; and the numeral 105 indicates a shutter which has a magnetic field-generating means 401 therein.

A still another modification of the sputtering apparatus of the present invention enables further stabilization of the composition of the formed film and more precise control of the film thickness. This modified sputtering apparatus comprises a constant-voltage DC power source for sputtering connected at least one pair of counterposed first sputtering targets, a calculation unit for calculating the power integrated on the basis of the constant-voltage value and the current value, and a comparison unit for comparing the inputted value of the integrated power calculated by the calculation unit with the intended integrated power, and outputting a power-stop signal to the constant voltage DC power source.

Figure 5:
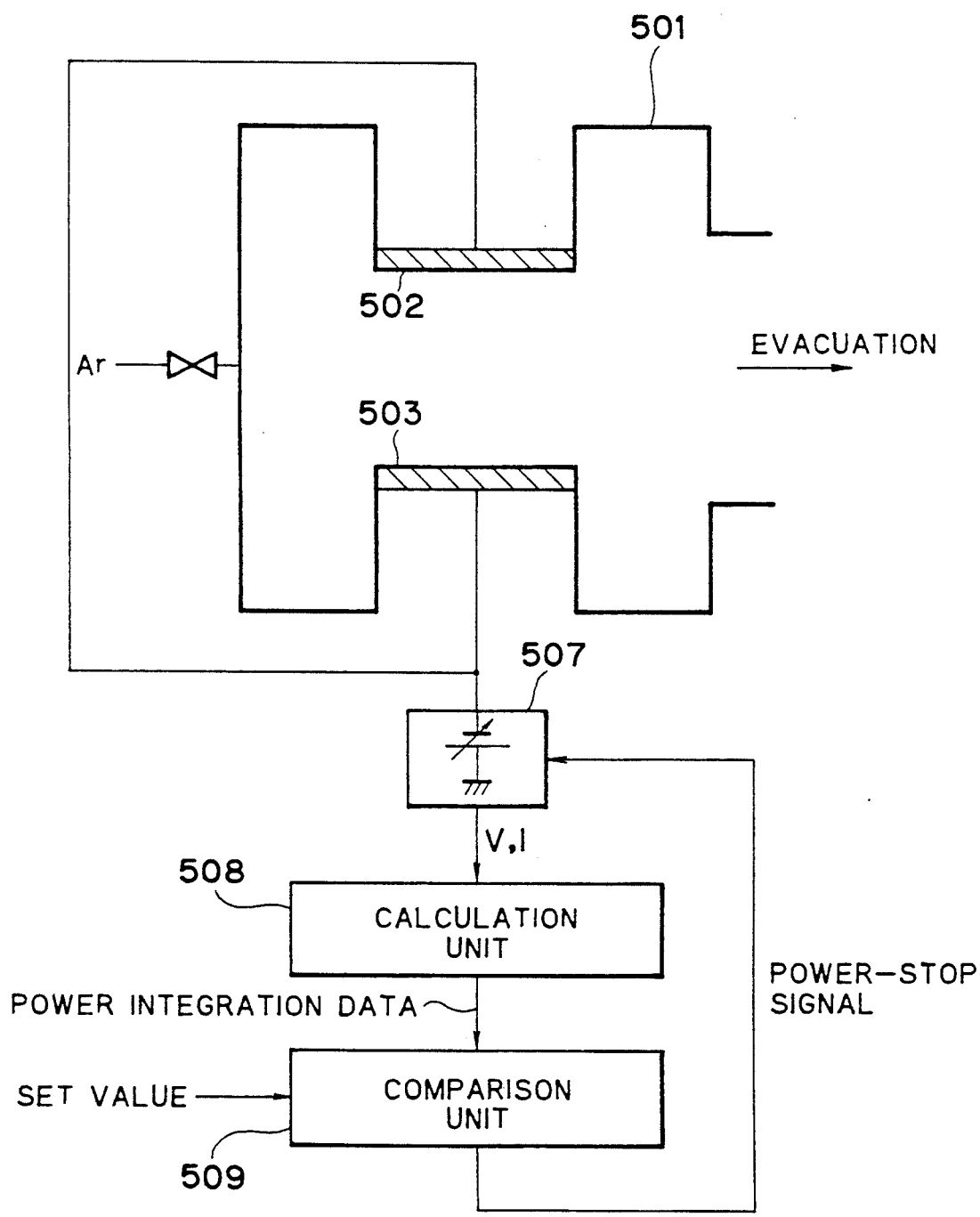
Figure 6:
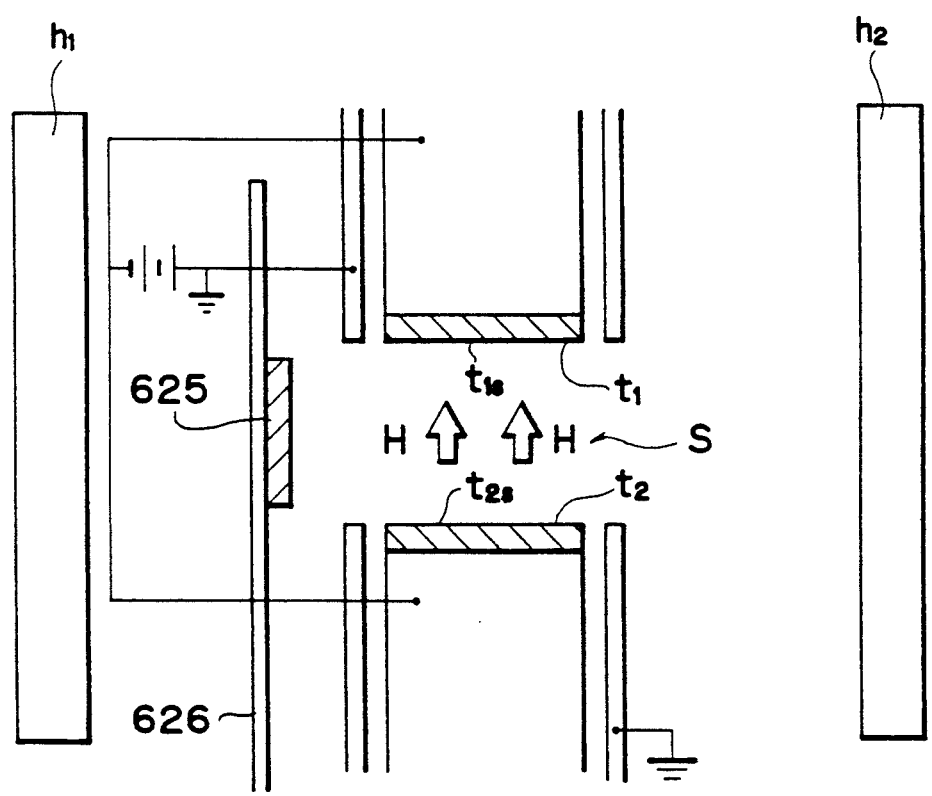
FIG. 6 is a schematic view showing an example of the conventional sputtering apparatuses.

FIG. 5 illustrates schematically such an apparatus. In FIG. 5, the numeral 501 indicates a vacuum chamber; the numerals 502 and 503 indicate a pair of counterposed sputtering targets; and the details of other constitutional members in the vacuum chamber 501 are omitted. The voltage generated by a sputtering DC power source 507 is changeable and can be set as desired. A calculation unit 508 reads the voltage value and the current value of the sputtering DC power source 507, calculates the power value, and calculates the integrated power value by integrating the power value. A comparison unit 508 compares the 10 integrated power value inputted from the calculation unit 508 with the intended value preliminarily set, and outputs a power-stop signal to the sputtering DC power source 507 when the integrated power value reaches the intended value.

The calculation unit 508 receives, after the start of the sputtering, the data of voltage value (constant) and current value several times per second, and calculates the average values of the voltage and the current per second, and therefrom calculates the supplying power for sputtering per second and further determines the integrated power value by integrating the power value. The comparison unit 509 outputs a signal to stop the voltage generation to the DC power source 507 when the integrated power value inputted from the calculation unit 508 has reached the predetermined value, thereby the sputtering being finished. As the calculation unit 508 and the comparison unit 509, a personal computer is useful, thereby the control being conducted readily.

The sputtering apparatus of the aforementioned constitution, which conducts sputtering by applying a desired constant voltage to the targets, stably gives a uniform magnetic thin film with a desired composition without fluctuation of the composition. Furthermore, the above sputtering apparatus is capable of giving a magnetic thin film with a desired film thickness since the film thickness is controlled by the integrated electric power.

What is claimed is:

1. A sputtering apparatus comprising at least one pair of first sputtering targets arranged in counterposition about a center axis; a second sputtering target provided substantially on a concentric circle having the same center axis as the first sputtering targets; and a substrate holder for holding a substrate to be coated with particles of target materials emitted from the first sputtering targets and the second sputtering target, which is provided substantially on another concentric circle having a diameter larger than that of the concentric circle of the second sputtering target.

2. A sputtering apparatus according to claim 1, wherein the first sputtering target comprises a magnetic material.

3. A sputtering apparatus according to claim 1, wherein the second sputtering target comprises a non-magnetic material.

4. A sputtering apparatus according to claim 1, wherein a shutter for shielding the second sputtering target from the substrate holder is further provided.

5. A sputtering apparatus according to claim 4, wherein the shutter is provided therein with a magnetic field-generating means.

6. A sputtering apparatus according to claim 1, wherein the substrate holder is capable of axial rotation and moving around the center axis of the first sputtering targets.

7. A sputtering apparatus according to claim 1, wherein a third sputtering target is further provided substantially on still another concentric circle having the same center axis as the first sputtering targets and the second sputtering target.

8. A sputtering apparatus according to claim 1, wherein a plurality of the substrate holders and a deposition-preventing plate between the adjacent substrate holders are provided.

9. A sputtering apparatus according to claim 1, wherein a constant-voltage DC power source is connected to the first sputtering target.

10. A sputtering apparatus according to claim 9, wherein a calculation unit for calculating an integrated power value based on a constant voltage value and a current value of the constant-voltage DC power source, and a comparison unit for comparing the integrated power value calculated by the calculation unit with an intended integrated power value, and for outputting a power-stop signal to the constant-voltage DC power source when the integrate power value reaches the intended integrated power value.

11. A process for forming a lamination film comprising the steps of vacuum evacuating a vacuum chamber; introducing a sputtering gas into the vacuum chamber; applying voltage onto at least one pair of first sputtering targets arranged in counterposition to generate plasma, thereby emitting particles of the material of the first sputtering targets by action of the plasma, and to coat with the particles of the material of first sputtering targets a substrate which is provided substantially on a concentric circle having a center axis of the first sputtering targets; and applying voltage onto a second sputtering target provided substantially on another concentric circle having a diameter smaller than that of the concentric circle of the substrate to generate plasma, thereby emitting particles of the second sputtering target by action of the plasma, and to coat the substrate with particles of the material of the second sputtering target.

12. A process for forming a lamination film according to claim 11, wherein the first sputtering target comprises a magnetic material, and the second sputtering target comprises a non-magnetic material.

13. A process for forming a lamination film according to claim 11, wherein the substrate is axially rotated and moved around the center axis of the first sputtering targets.

14. A process for forming a lamination film according to claim 11, wherein a constant DC voltage is applied to the first sputtering target.

15. A process for forming a lamination film according to claim 14, wherein the lamination film is formed by comparing with an intended integrated electric power value an integrated electric power value determined from the constant DC voltage and a current from a source of the constant DC voltage.

* * * * *

UNITED STATES PATENT AND TRADEMARK OFFICE
CERTIFICATE OF CORRECTION

PATENT NO. : 5,328,583

DATED : July 12, 1994

INVENTOR(S) : MAKOTO KAMEYAMA, ET AL.

It is certified that error appears in the above-identified patent and that said Letters Patent is hereby corrected as shown below:

COLUMN 1

Line 16, insert: --2. Related Background Art--.
    Line 21, "of" should be deleted.

COLUMN 3

Line 12, "a" should be deleted.
    Line 40, "shut" should read --shuts--.

COLUMN 4

Line 10, "the" should read --their--.
    Line 20, "target 103" should read --target 103,--.

COLUMN 5

Line 54, "1" should be deleted.

COLUMN 7

Line 49, "10" should read deleted.

UNITED STATES PATENT AND TRADEMARK OFFICE
CERTIFICATE OF CORRECTION

PATENT NO. : 5,328,583
DATED : July 12, 1994
INVENTOR(S) : MAKOTO KAMEYAMA, ET AL.

It is certified that error appears in the above-identified patent and that said Letters Patent is hereby corrected as shown below:

COLUMN 8

Line 60, "integrate" should read --integrated--.

Signed and Sealed this

Twentieth Day of December, 1994

BRUCE LEHMAN

Attest:

Attesting Officer

Commissioner of Patents and Trademarks